United States Patent
Homma (10) Patent No.: US 12,202,002 B2
(45) Date of Patent: Jan. 21, 2025

(54) APPLICATION DEVICE FOR APPLYING ADHESIVE, AND ADHESIVE APPLICATION METHOD

(71) Applicant: NHK SPRING CO., LTD., Yokohama (JP)

(72) Inventor: Akira Homma, Yokohama (JP)

(73) Assignee: NHK SPRING CO., LTD., Kanagawa (JP)

(*) Notice: Subject to any disclaimer, the term of this patent is extended or adjusted under 35 U.S.C. 154(b) by 281 days.

(21) Appl. No.: 17/968,751

(22) Filed: Oct. 18, 2022

(65) Prior Publication Data

US 2023/0042593 A1    Feb. 9, 2023

Related U.S. Application Data

(62) Division of application No. 17/200,712, filed on Mar. 12, 2021, now Pat. No. 11,998,943.

(30) Foreign Application Priority Data

Mar. 16, 2020    (JP) .................. 2020-045382

(51) Int. Cl.
  *B05D 5/10*    (2006.01)
  *B05C 5/02*    (2006.01)
  (Continued)

(52) U.S. Cl.
  CPC ........ *B05C 11/1005* (2013.01); *B05C 5/0212* (2013.01); *B05C 11/1013* (2013.01);
  (Continued)

(58) Field of Classification Search
  CPC ..... B05D 5/10; B05C 11/1005; B05C 5/0212; Y10T 156/1798
  See application file for complete search history.

(56) References Cited

U.S. PATENT DOCUMENTS

5,867,390 A  *  2/1999  Kinoh ................. B05C 11/1005
                                                       700/123
7,931,933 B2     4/2011  Holm et al.
(Continued)

FOREIGN PATENT DOCUMENTS

CN    101952049 A    1/2011
CN    103391820 A    11/2013
(Continued)

OTHER PUBLICATIONS

Office Action (Non-Final Rejection) dated Sep. 13, 2023, issued in parent U.S. Appl. No. 17/200,712.
(Continued)

*Primary Examiner* — Dah-Wei D. Yuan
*Assistant Examiner* — Stephen A Kitt
(74) *Attorney, Agent, or Firm* — Holtz, Holtz & Volek PC (57) ABSTRACT

An application method for applying an adhesive to an object includes applying, prior to applying the adhesive to a specified part of the object, the adhesive to a part different from the specified part, calculating an application quantity of the adhesive applied to the part different from the specified part, making a first correction configured to correct an application condition of the adhesive based on basis of a result of the calculation, and applying the adhesive to the specified part using the application condition corrected in the first correction.

8 Claims, 6 Drawing Sheets

(51) Int. Cl.
  B05C 11/10 (2006.01)
  H05K 13/04 (2006.01)
  B05C 1/04 (2006.01)

(52) U.S. Cl.
  CPC .................. B05D 5/10 (2013.01); *B05C 1/04* (2013.01); *B05C 5/0216* (2013.01); *H05K 13/0469* (2013.01); *Y10T 156/1798* (2015.01)

(56) References Cited

U.S. PATENT DOCUMENTS

| | | | |
|---|---|---|---|
| 9,144,820 B2 | 9/2015 | Ikushima | |
| 10,086,573 B2 | 10/2018 | Ikushima | |
| 2002/0071772 A1* | 6/2002 | Isogai | F04C 13/002 417/310 |
| 2007/0071772 A1 | 3/2007 | Kovbasnjuk et al. | |
| 2013/0321958 A1 | 12/2013 | Ikeji et al. | |
| 2018/0321604 A1 | 11/2018 | Namba et al. | |
| 2019/0240689 A1* | 8/2019 | Girvin | B05B 12/085 |

FOREIGN PATENT DOCUMENTS

| | | | |
|---|---|---|---|
| JP | H01135561 A | | 5/1989 |
| JP | H0399831 A | | 4/1991 |
| JP | 2007098306 A | * | 4/2007 |
| JP | 2013251018 A | | 12/2013 |
| JP | 2017144367 A | * | 8/2017 |

OTHER PUBLICATIONS

Notice of Allowance dated Feb. 21, 2024, issued in parent U.S. Appl. No. 17/200,712.

Japanese Office Action (and an English language translation thereof) dated Jun. 6, 2023, issued in counterpart Japanese Application No. 2020-045382.

Chinese Office Action dated Jul. 4, 2022 (and English translation thereof) issued in counterpart Chinese Application No. 202110271628.5.

* cited by examiner

APPLICATION DEVICE FOR APPLYING ADHESIVE, AND ADHESIVE APPLICATION METHOD

CROSS-REFERENCE TO RELATED APPLICATIONS

This application is a Divisional Applications of U.S. application Ser. No. 17/200,712, filed Mar. 12, 2021, which is based upon and claims the benefit of priority from prior Japanese Patent Application No. 2020-045382, filed Mar. 16, 2020, the entire contents of both of which are incorporated herein by reference.

BACKGROUND OF THE INVENTION

1. Field of the Invention

The present invention relates to an application method used to apply an adhesive and application device.

2. Description of the Related Art

A hard disk device (HDD) is used in an information processing device such as a personal computer or the like. The hard disk device includes a magnetic disk rotating around a spindle, carriage turned around a pivot shaft, and the like. The carriage includes an actuator arm and is turned around the pivot shaft by a positioning motor such as a voice coil motor or the like in the track-width direction of the disk.

A disk-device suspension (hereinafter simply referred to as a suspension) is attached to the actuator arm. The suspension includes a load beam, flexure arranged on the load beam in a double-layered form, and the like. A gimbal section formed in the vicinity of the tip of the flexure is provided with a slider constituting a magnetic head. The slider is provided with an element (transducer) configured to make access such as read or write of data. A head gimbal assembly is constituted of the load beam, flexure, slider, and the like.

The aforementioned gimbal section includes a tongue on which the slider is mounted, and a pair of outriggers formed on both sides of the tongue. Each of the outriggers has a shape outwardly protruding from one of both sides of the flexure. Each of vicinities of both ends of each of the outriggers in the longitudinal direction is fixed to the load beam by, for example, laser welding or the like. Each of the outriggers can be bent in the thickness direction like a spring, and takes an important role from the viewpoint of securing the gimbal motion of the tongue.

In order to cope with high recording-densification of the disk, it is necessary to further downsize the head gimbal assembly, and downsizing of the actuator to be mounted on the suspension is advanced from the dual stage actuator (DSA) type to the co-located actuator (CLA) type. For this reason, application quantity management of the adhesive to be used for fixing of the actuator has become increasingly important.

The application process of an adhesive is carried out by discharging the adhesive from a syringe to which a predetermined air pressure is applied by means of a dispenser in some cases. In this case, with the elapse of time from starting of application, the viscosity of the adhesive increases, and hence there is a problem that even when the adhesive is applied with constant air pressure, the application quantity of the adhesive reduces.

As a method of managing the application quantity of the adhesive coping with such a problem, there is a method of managing the application quantity of the adhesive by the application height (for example, JP 2013-251018 A). In this method, the pressure corresponding to the usage elapsed time is set in advance in such a manner that the applied adhesive has a height greater than or equal to a target height, and the application height is maintained by applying the adhesive at the preset pressure.

For example, in an article requiring an ultramicro application quantity such as an actuator of the CLA type which is currently the main stream of the actuators, not only the chronological change in the viscosity of the adhesive, but also a very small variation in the application quantity attributable to a difference in viscosity due to a difference in production lot of the adhesive, idiosyncrasy or tendency of the production facility of the suspension, variation in the adhesive application nozzle diameter, and the like becomes a problem.

In the aforementioned method in which the pressure is set according to the usage elapsed time, it has become difficult to meet, with a high degree of accuracy, the requirement to keep the application quantity constant. Even when the application quantity of the adhesive is monitored, and correction is made as the need arises, the actual application quantity cannot be accurately corrected by a correction based on a simple fixed coefficient, and hence, as a result, the correction has to be repeated, thereby leading to a deterioration in takt time. As described above, there is yet room for various improvements in the application method of the adhesive.

BRIEF SUMMARY OF THE INVENTION

The present invention makes it one of the objects thereof to provide an application method and application device making it possible to apply an adhesive with a high degree of accuracy.

According to an embodiment, an application method configured to apply an adhesive to an object comprises: applying, prior to applying the adhesive to a specified part of the object, the adhesive to a part different from the specified part; calculating an application quantity of the adhesive applied to the part different from the specified part; making a first correction configured to correct an application condition of the adhesive on the basis of a result of the calculation; and applying the adhesive to the specified part on the application condition corrected in the first correction.

In the first correction, a correction amount is set on the basis of at least one of an amount of correction to the application condition in a second correction which is a correction made prior to the first correction, and a correction interval from the second correction to the first correction.

The calculating may include imaging the adhesive applied to the part different from the specified part by a camera, and obtaining the application quantity of the adhesive on the basis of an image acquired by imaging of the camera.

In the first correction, the correction amount may be set on the basis of both the correction amount in the second correction and the correction interval. The application condition may be an application pressure used to discharge the adhesive. When the correction interval is less than a specified time, the correction amount of the application pressure in the first correction may be greater than the correction amount of the application pressure in the second correction.

According to an embodiment, an application device configured to apply an adhesive to an object comprises a dispenser configured to discharge the adhesive toward the object and a control device configured to control a discharge of the adhesive.

The control device makes the dispenser, prior to applying the adhesive to a specified part of the object, apply the adhesive to a part different from the specified part, calculates an application quantity of the adhesive applied to the part different from the specified part, makes a first correction configured to correct an application condition of the adhesive on the basis of a result of the calculation, and makes the dispenser apply the adhesive to the specified part on the application condition corrected in the first correction.

In the first correction, a correction amount is set on the basis of at least one of an amount of correction to the application condition in a second correction which is a correction made prior to the first correction, and a correction interval from the second correction to the first correction.

The application device may further comprise a camera configured to image the adhesive applied to the part different from the specified part. The control device may obtain an application quantity of the adhesive on the basis of an image acquired by imaging of the camera. The control device may set a correction amount in the first correction on the basis of both the correction amount in the second correction and the correction interval. The application condition may be an application pressure used to discharge the adhesive. When the correction interval is less than a specified time, the control device may set the correction amount of the application pressure in the first correction greater than the correction amount of the application pressure in the second correction.

According to the present invention, an application method and application device making it possible to apply an adhesive with a high degree of accuracy will be achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will be described with reference to the accompanying drawings.

As an application device according to this embodiment, an application device applicable to a manufacturing process of a suspension for a disk device is exemplified. The application device is applicable not only to the manufacturing process of the suspension but also to manufacturing processes of other articles. In the drawings, relative sizes and positions of the members constituting the application device are schematically shown in some cases. It should be noted that the present invention is not limited by the embodiment to be described hereinafter.

Figure 1:
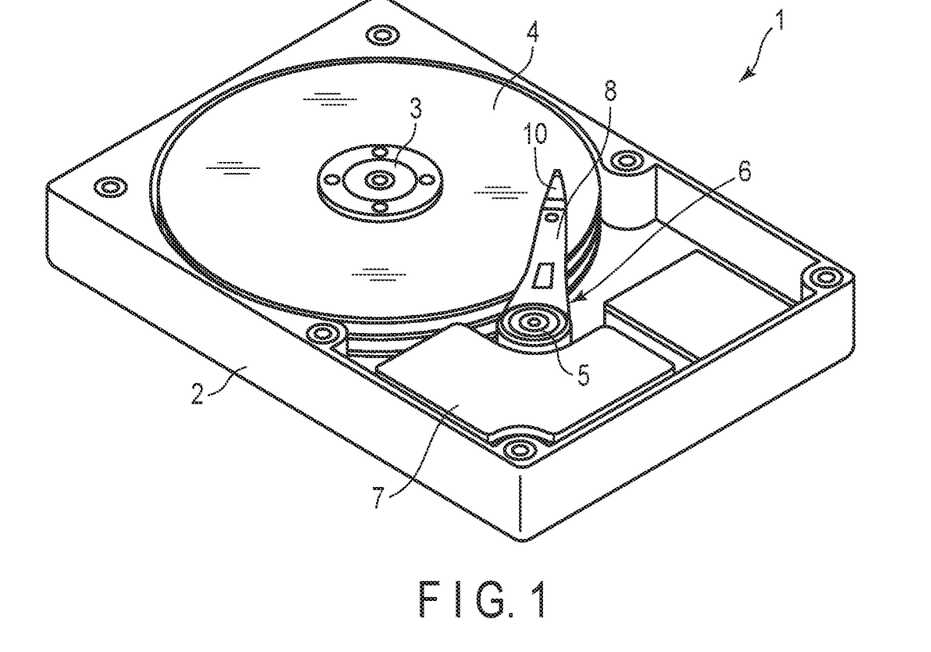
FIG. 1 is a schematic perspective view showing an example of a disk device.

FIG. 1 is a schematic perspective view showing an example of a disk device 1. As shown in FIG. 1, the disk device (HDD) 1 is provided with a case 2, a plurality of disks 4 to be rotated around a spindle 3, carriage 6 which can be turned around a pivot shaft 5, and positioning motor (voice coil motor) 7 configured to drive the carriage 6. The case 2 is tightly closed with a lid not shown.

Figure 2:
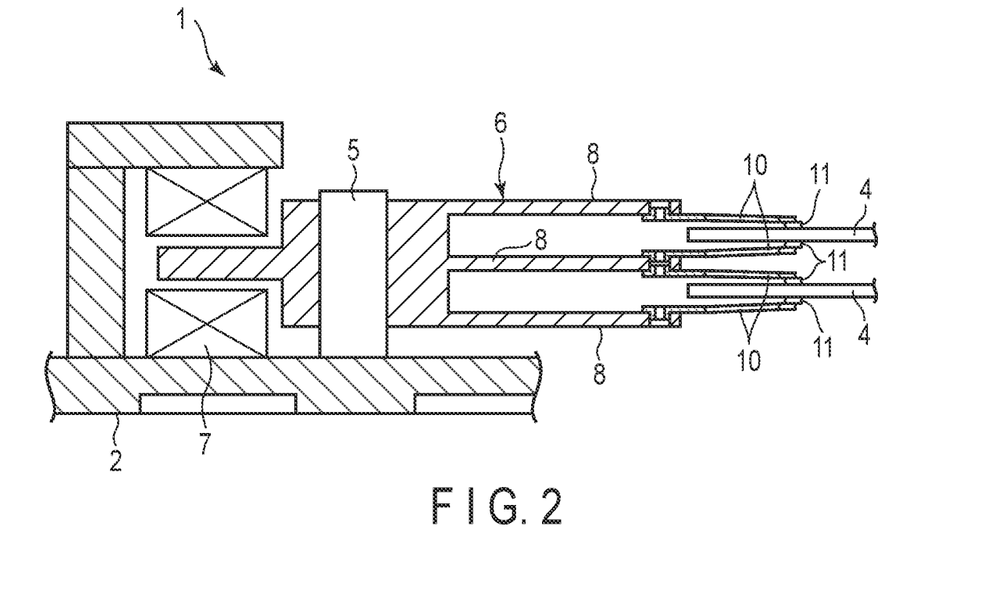
FIG. 2 is a schematic cross-sectional view of the disk device shown in FIG. 1.

FIG. 2 is a schematic cross-sectional view of the disk device 1 shown in FIG. 1. The carriage 6 is provided with arms 8. A suspension or suspensions 10 is or are attached to a tip section of each of the arms 8. A slider 11 constituting a magnetic head is mounted on a tip section of the suspension 10. When the disk 4 is rotated at a high rotational speed, air is made to flow into a gap between the disk 4 and slider 11, whereby an air bearing is formed.

When the carriage 6 is turned by the voice coil motor 7, the suspension 10 is moved in the radial direction of the disk 4, whereby the slider 11 is moved to a desired track of the disk 4.

Figure 3:
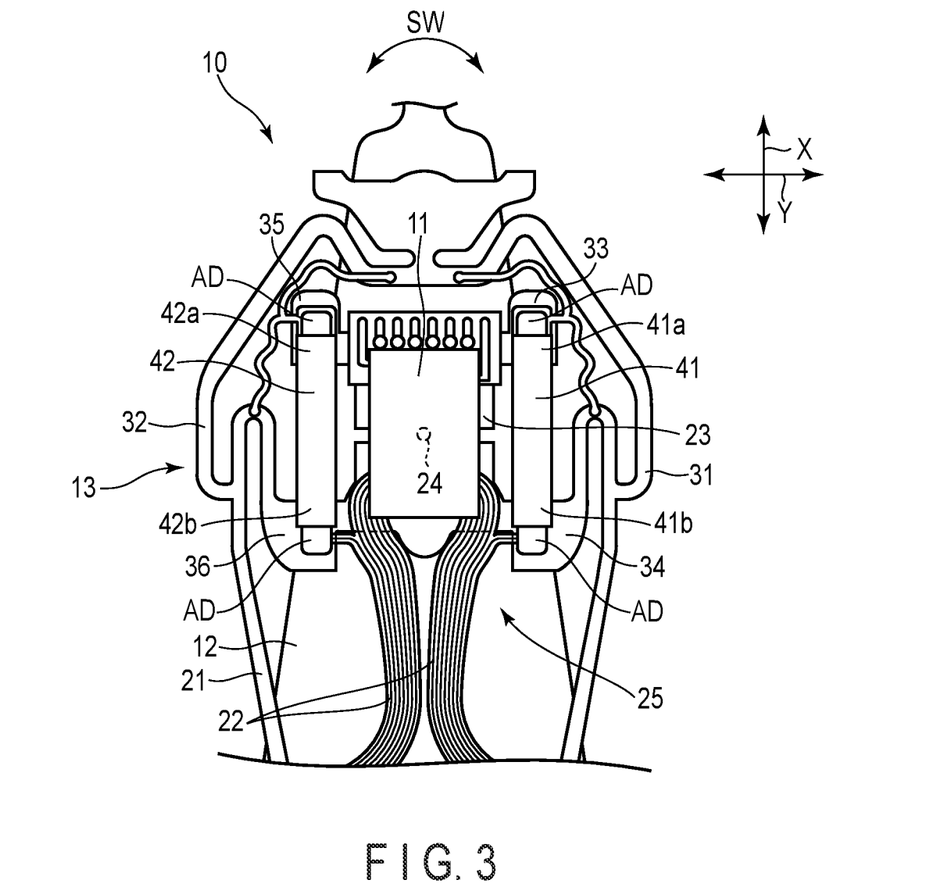
FIG. 3 is a schematic plan view of the vicinity of a tip section of a suspension.

FIG. 3 is a schematic plan view of the vicinity of the tip section of the suspension 10. In the example shown in FIG. 3, the vicinity of the tip section of the suspension 10 is viewed from the slider 11 side. The suspension 10 is provided with a base plate (not shown) fixed to the arm 8 (shown in FIG. 1 and FIG. 2) of the carriage 6, load beam 12, and flexure 13. The flexure 13 is arranged along the load beam 12. The flexure 13 is fixed to the load beam 12 by laser-spot welding or the like.

Each of the load beam 12 and flexure 13 extends in the longitudinal direction X of the suspension 10. Hereinafter, the direction orthogonal to the longitudinal direction X is referred to as the width direction Y of the suspension 10, load beam 12, flexure 13, and the like. Further, the sway direction SW is indicated by an arc-like arrow in the vicinity of the tip of the load beam 12.

The flexure 13 includes a metal base 21 constituted of a thin stainless steel sheet, and wiring section 22 arranged along the metal base 21. The thickness of the metal base 21 is less than the thickness of the load beam 12. Part of the wiring section 22 is electrically connected to elements of the slider 11 through terminals for the slider 11. The flexure 13 includes a tongue 23, first outrigger 31, and second outrigger 32. On the tongue 23, the slider 11 is mounted.

At the tip section of the slider 11 constituting the magnetic head, elements (not shown) capable of converting between a magnetic signal and electric signal such as MR elements are provided. By means of these elements, access to the disk 4 such as write or read of data to or from the disk 4 is made. A head gimbal assembly is constituted of the slider 11, load beam 12, flexure 13, and the like.

The first outrigger 31 and second outrigger 32 are respectively arranged on both sides of the tongue 23 in the width direction Y thereof. The first outrigger 31 and second outrigger 32 have shapes outwardly protruding from the both sides of the tongue 23 in width direction Y thereof. Each of the tongue 23, first outrigger 31, and second outrigger 32 is part of the metal base 21, and the contour thereof is formed by, for example, etching.

In the vicinity of the tip of the load beam 12, a dimple 24 protruding toward the tongue 23 is formed. The tip of the dimple 24 is in contact with the tongue 23. The tongue 23 oscillates with the tip of the dimple 24 serving as the center of oscillation, whereby the tongue 23 can carry out the desired gimbal motion. A gimbal section 25 is constituted of the tongue 23, first outrigger 31, second outrigger 32, dimple 24, and the like.

On the gimbal section 25, a first micro-actuator element 41 and second micro-actuator element 42 are mounted. The micro-actuator elements 41 and 42 are arranged on both sides of the slider 11 in the width direction Y thereof.

Each of the micro-actuator elements 41 and 42 is constituted of a piezoelectric body such as lead zirconate titanate (PZT) or the like. The micro-actuator elements 41 and 42 have a function of turning the tongue 23 in the sway direction SW.

Both end sections 41a and 41b of the first micro-actuator element 41 are respectively connected to actuator-supporting sections 33 and 34 of the tongue 23 through an adhesive AD. Both end sections 42a and 42b of the second micro-actuator element 42 are respectively connected to actuator-supporting sections 35 and 36 of the tongue 23 through an adhesive AD.

As the adhesive AD, for example, a non-conductive adhesive or conductive adhesive is used. The adhesive AD is, for example, a conductive adhesive. The conductive adhesive is an adhesive formed by dispersing a conductive filler in a basis (binder). As an example of the conductive adhesive, there is a silver paste formed by dispersing a silver powder in a basis such as an epoxy resin or the like. In the adhesive AD, when the usage elapsed time becomes long, due to volatilization or the like of the solvent contained in the adhesive, the viscosity of the adhesive changes in some cases. For example, in applying the adhesive AD, when the application quantity is less than the defined quantity, the adhesive strength of the adhesive AD becomes insufficient, whereby the function of turning the tongue 23 in the sway directions SW to be carried out by the micro-actuator elements 41 and 42 is not satisfactorily fulfilled.

Figure 4:
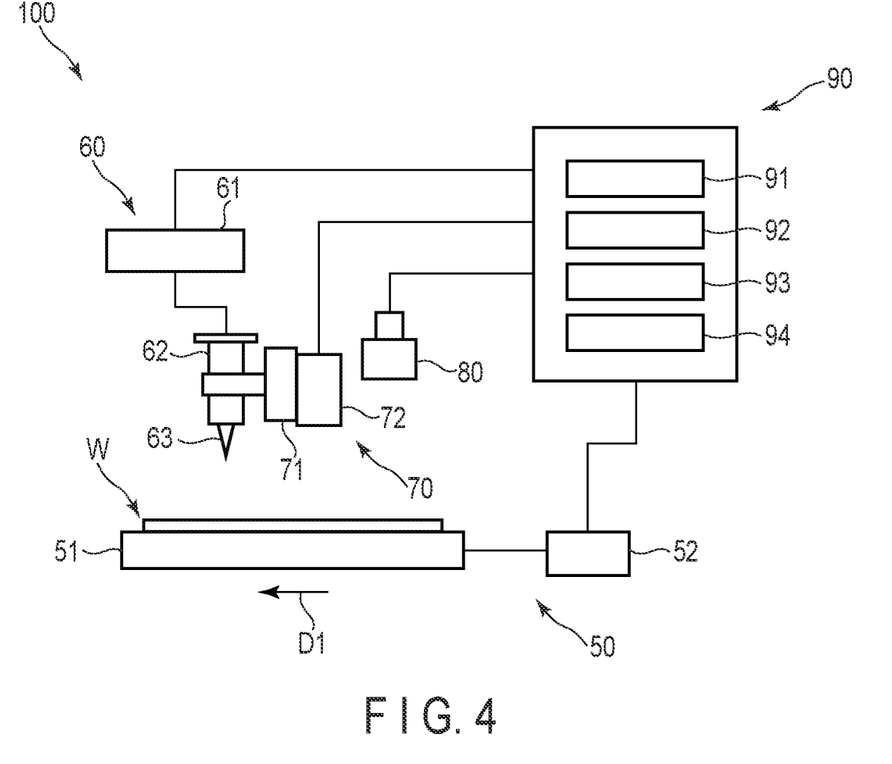
FIG. 4 is a view showing the schematic configuration of an application device according to this embodiment.

FIG. 4 is a view showing the schematic configuration of an application device 100 according to this embodiment. The application device 100 is used for, for example, a manufacturing process of the suspension 10. The application device 100 according to this embodiment is applicable not only to the manufacturing process of the suspension 10 but also to manufacturing processes of other articles.

The application device 100 is provided with a conveying device 50, dispenser 60, position control device 70, camera 80, and control device 90. Each of the conveying device 50, dispenser 60, position control device 70, and camera 80 is communicably connected to the control device 90. The control device 90 is configured to be able to control each of the conveying device 50, dispenser 60, position control device 70, and camera 80.

The conveying device 50 includes a movable stage 51 and stage drive mechanism 52 configured to move the movable stage 51 in a direction indicated by an arrow D1. On the movable stage 51, an object W to be processed by the application device 100 is placed. The object W arranged on the movable stage 51 is conveyed in the direction indicated by the arrow D1.

The dispenser 60 is a device configured to discharge the adhesive toward the object W. The dispenser 60 includes a discharge drive mechanism 61 and syringe 62 in which the adhesive is contained. Compressed air is supplied to the discharge drive mechanism 61 from an air supply source (not shown). In the discharge drive mechanism 61, pressure regulation can be carried out and, pressure-regulated compressed air is supplied to the syringe 62. The syringe 62 includes a nozzle 63 configured to discharge the adhesive at a tip thereof. The adhesive is applied from the nozzle 63 to the specified part of the object W arranged on the movable stage 51. In this embodiment, the dispenser 60 employs, for example, a pneumatic discharging method, and hence by regulating the pressure of the compressed air to be supplied to the syringe 62 by means of the discharge drive mechanism 61, it is possible to adjust the application quantity of the adhesive.

The position control device 70 includes a holding jig 71 and syringe drive mechanism 72. The holding jig 71 holds the syringe 62 above the movable stage 51. The syringe drive mechanism 72 moves the syringe 62 and holding jig 71 above the movable stage 51. The syringe 62 and holding jig 71 can be moved by the syringe drive mechanism 72 not only in a plane parallel to the movable stage 51 but also in a direction perpendicular to the movable stage 51.

The camera 80 is held in such a manner as to be able to image the object W arranged on the movable stage 51. Further, the camera 80 may also be held by a different position control device or the like as in the case of the syringe 62 in such a manner that the camera 80 can be driven by the position control device. The camera 80 is, for example, a CMOS camera, CCD camera or the like. The camera 80 may further be provided with a light source (such as an LED illuminator or the like) configured to irradiate the object W with light. The number of camera 80 is not limited to one, and a plurality of cameras 80 may be provided. For example, the camera 80 may be constituted of a plurality of cameras, for example, a camera for imaging the object W from above, and camera for imaging the object W from the side, and the like.

The control device 90 controls the application quantity of the adhesive. The control device 90 includes a drive control module 91, discharge control module 92, imaging control module 93, and calculation control module 94. The drive control module 91 controls the stage drive mechanism 52 to thereby convey the object W arranged on the movable stage 51 to a predetermined position. Further, the drive control module 91 controls the syringe drive mechanism 72 to thereby position the syringe 62 relatively to the object W.

The discharge control module 92 controls the dispenser 60 to thereby make the dispenser 60 discharge the adhesive from the syringe 62 toward the object W. It is possible for the discharge control module 92, by controlling the discharge drive mechanism 61 of the dispenser 60, not only to set the timing for applying the adhesive but also to execute setting of an application condition for applying the adhesive and making a correction to the application condition. The application condition to which a correction can be made by the discharge control module 92 is, for example, the pressure or the like of the compressed air to be supplied to the syringe 62. The pressure of the compressed air to be supplied to the syringe 62 in order to discharge the adhesive is called the application pressure.

The imaging control module 93 controls the camera 80 to thereby make the camera 80 image the object W. The calculation control module 94 calculates the application quantity of the adhesive on the basis of the image acquired by imaging of the camera 80. Furthermore, the calculation control module 94 determines, on the basis of a predetermined criterion, whether or not the application quantity of the adhesive is within the specified range. Further, on the basis of the determination result obtained by the calculation control module 94, the discharge control module 92 sets an amount of a correction to be made to the application condition for applying the adhesive, and makes the correction.

The application device 100 may also be defined as a device including elements other than the constituent elements shown in FIG. 4. For example, the application device 100 may also be provided with output devices such as a monitor configured to display the application condition, communication unit configured to transmit the application condition to another device through a network, and the like. Further, the application device 100 may be configured as an independent system or may be incorporated in a different device as part of the device.

Figure 5:
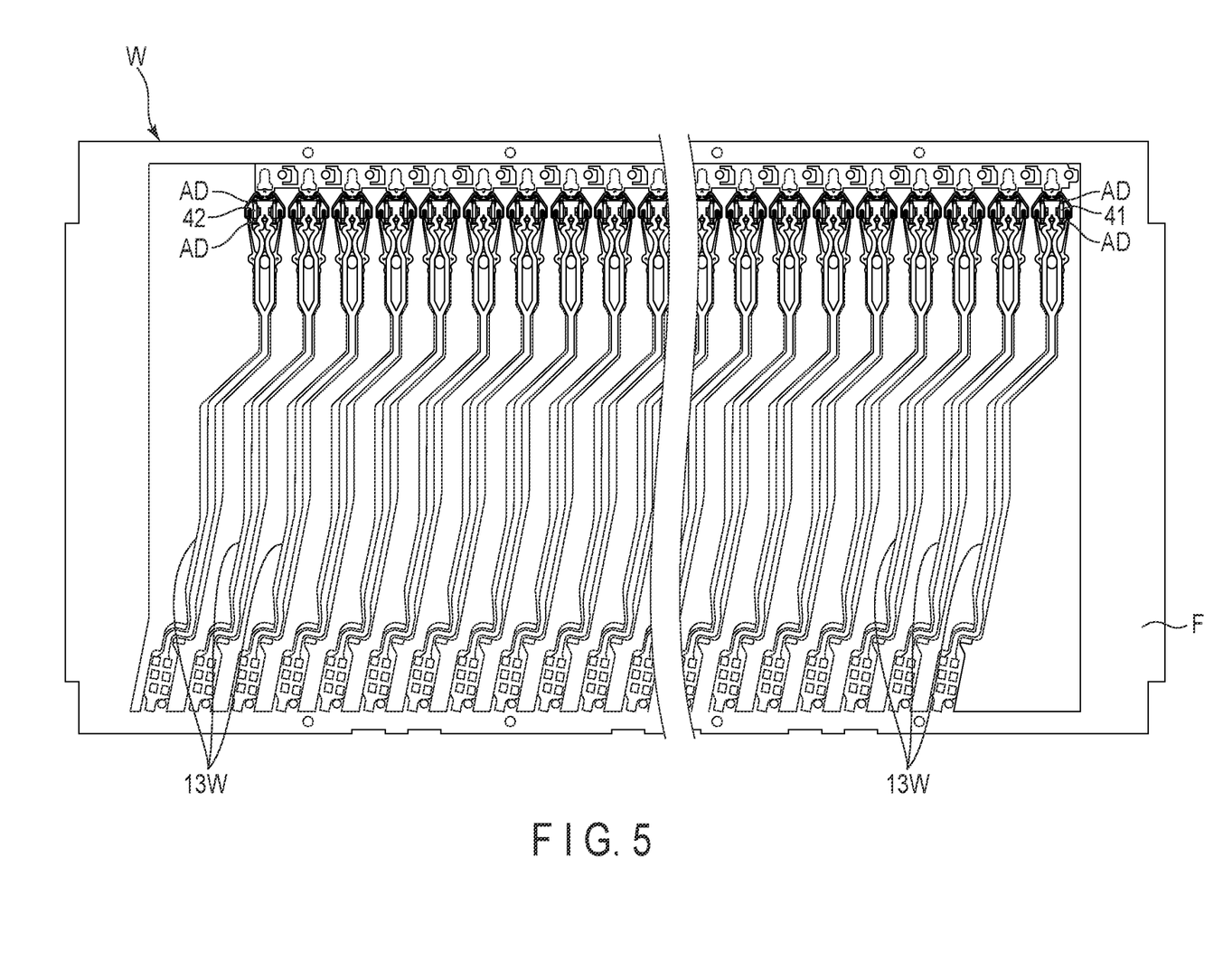
FIG. 5 is a view showing an example of a state where micro-actuator elements are mounted on the object.

FIG. 5 is a view showing an example of the state where micro-actuator elements 41 and 42 are mounted on the object W. The object W is, for example, a flexure-concatenated sheet formed by concatenating a plurality of flexure elements 13W. The object W includes a plurality of flexure elements 13W and frame F configured to fix thereon the plurality of flexure elements 13W.

The flexure element 13W has a configuration identical to the flexure 13. The object W includes a layer formed by processing a stainless steel sheet by etching or the like, conductor layer formed of copper or the like, and insulating layer formed of polyimide or the like. The adhesive is applied to the flexure elements 13W of the object W and, thereafter micro-actuator elements 41 and 42 are mounted on the flexure elements 13W, whereby the state shown in FIG. 5 is acquired. The micro-actuator elements 41 and 42 are respectively connected to the actuator-supporting sections 33 and 34 and actuator-supporting sections 35 and 36 shown in FIG. 3. For example, at the tip section of the suspension 10 in FIG. 3, the application device 100 applies the adhesive AD to the actuator-supporting sections 33 and 34 and actuator-supporting sections 35 and 36.

Figure 6:
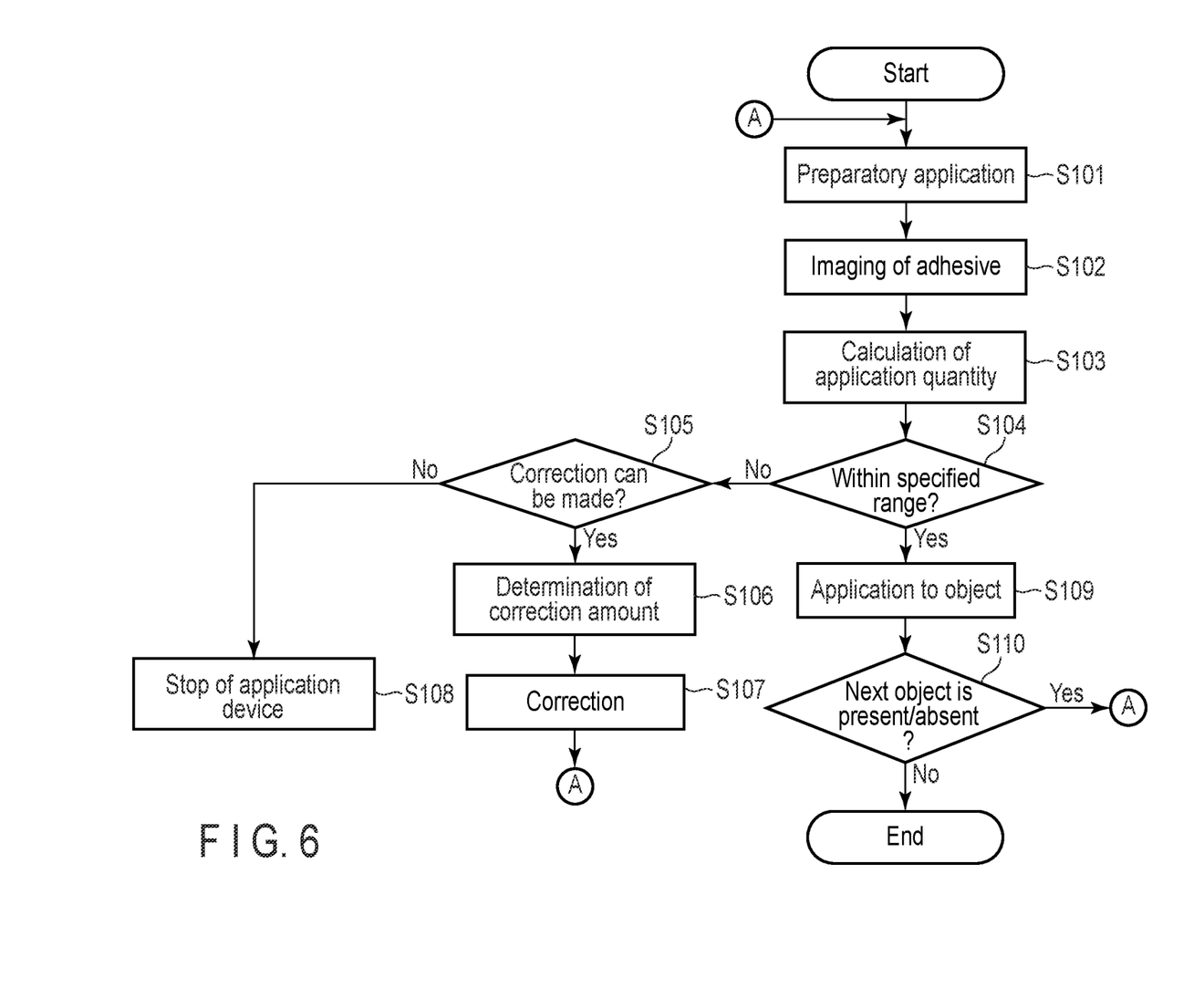
FIG. 6 is a flowchart showing an example of operations of the application device according to this embodiment.

FIG. 6 is a flowchart showing an example of operations of the application device 100 according to this embodiment. The operations shown by the flowchart are executed by the control device 90. The control device 90 includes a computer constituted of a processor, memory, and the like. For example, the processor included in the control device 90 executes the computer program stored in the memory, whereby the aforementioned drive control module 91, discharge control module 92, imaging control module 93, and calculation control module 94 are realized.

Execution of the computer program may also be realized by using a plurality of processors. At least one of the modules 91 to 94 may be a separate device independent of the control device 90.

First, prior to starting of the operations for applying the adhesive to be carried out by the application device 100, the object W is arranged on the movable stage 51. Arrangement of the object W may be executed by the control device 90 or may be executed by a different device.

When the operation of the application device 100 is started, the drive control module 91 controls the stage drive mechanism 52, whereby the object W arranged on the movable stage 51 is conveyed to a predetermined position. Further, the drive control module 91 controls the syringe drive mechanism 72, whereby the nozzle 63 of the syringe 62 is positioned to a part different from the specified part of the object W. The part different from the specified part implies, for example, part of the frame F of the object W shown in FIG. 5. Further, as the part different from the specified part, a stage for application of the adhesive may separately be provided in advance inside the application device 100.

When the nozzle 63 is positioned, the discharge control module 92 controls the discharge drive mechanism 61 to make the mechanism 61 discharge the adhesive from the nozzle 63, whereby the adhesive is applied to the part different from the specified part (step S101). When the adhesive is applied, the imaging control module 93 controls the camera to thereby make the camera 80 image the applied adhesive (step S102). The image acquired by imaging of the camera 80 is stored in the control device 90. The stored image may be subjected to image processing such as noise removal, correction for brightness of the image, and the like as the need arises.

The calculation control module 94 calculates the application quantity of the applied adhesive on the basis of the image acquired by imaging of the camera 80 (step S103). For example, when the planar shape of the applied adhesive is circular, the application quantity A of the adhesive can be calculated by using the following approximate expression 1. In the approximate expression 1, h is the height of the applied adhesive, and r is a radius of the area to which the adhesive is applied.

$$A = 2 \times \pi h \times r^2 / 3 \qquad \text{[Approximate Expression 1]}$$

Further, for example, when the planar shape of the applied adhesive is an ellipse, the application quantity A of the adhesive can be calculated by using the following approximate expression 2. In the approximate expression 2, $r_1$ is a major axis radius of the area to which the adhesive is applied, and $r_2$ is a minor axis radius of the area.

$$A = 2 \times \pi \times h \times r_1 \times r_2 / 3 \qquad \text{[Approximate Expression 2]}$$

Each of the height h, radius r, major axis radius $r_1$, and minor axis radius $r_2$ can be measured from the image acquired by imaging of the camera 80. In order to accurately measure the height h, and radii r, $r_1$, and $r_2$, images acquired by imaging from a plurality of directions may be used.

The calculation control module 94 determines whether or not the application quantity of the adhesive calculated in step S103 is within the specified range (step S104). The specified range of the application quantity may be stored in advance in the control device 90.

When the application quantity of the adhesive is not within the specified range (No of step S104), then the calculation control module 94 determines whether or not a correction can be made by the application device 100 on the basis of the application quantity of the adhesive (step S105). The determination as to whether or not the correction by the application device 100 is possible is made on the basis of whether or not the application quantity is within the correction-enabled range. That is, when the application quantity of the adhesive is outside the specified range and is within the correction-enabled range, it is determined that a correction can be made by the application device 100. On the other hand, when the application quantity of the adhesive is outside the specified range and is outside the correction-enabled range, it is determined that a correction cannot be made by the application device 100.

When a correction can be made by the application device 100 (Yes of step S105), the discharge control module 92 determines the necessary correction amount (step S106). The necessary correction amount will be described in connection with FIG. 7 to be described later. The discharge control module 92 makes a correction to the application condition on the basis of the determined correction amount (step S107). Then, the flow is returned to step S101 again, and it is confirmed whether or not the application quantity of the adhesive to be applied on the corrected application condition is within the specified range.

On the other hand, when a correction cannot be made by the application device 100 (No of step S105), the control device 90 stops the application device 100 on the basis of the determination result of the calculation control module 94 (step S108). At this time, the abnormal stop of the application device 100 may be notified to the worker by an indication on a display, lighting up or blinking of a lamp, generation of a warning beep from a speaker or the like. When the application device 100 is stopped, appearance inspection of the application device 100, and adjustment of the application quantity based on a manual operation of the application device 100 are executed by the worker, and inspection of each of the devices constituting the application device 100 is further executed as the need arises.

When the application quantity of the adhesive is within the specified range (Yes of step S104), the discharge control module 92 controls the discharge drive mechanism 61 to thereby make the mechanism 61 apply the adhesive to the specified part of the object W (step S109). After the application of the adhesive to the specified part of the object W is completed, the control device 90 determines whether or not an object W to which the adhesive is to be applied next is present (step S110). Further, in step S109, when a predetermined time has elapsed before the transition to step S110, confirmation of the application quantity of the adhesive may be carried out by executing the operations of steps S101 to S104 again.

When an object W to which the adhesive is to be applied next is present (Yes of step S110), the flow is returned to step S101 again. These steps are repetitively executed until the object W to which the adhesive is to be applied disappears. After repetitively executing the above steps, when there is no object W to be applied next (No of step S110), the operation to be carried out by the application device 100 is terminated.

Figure 7:
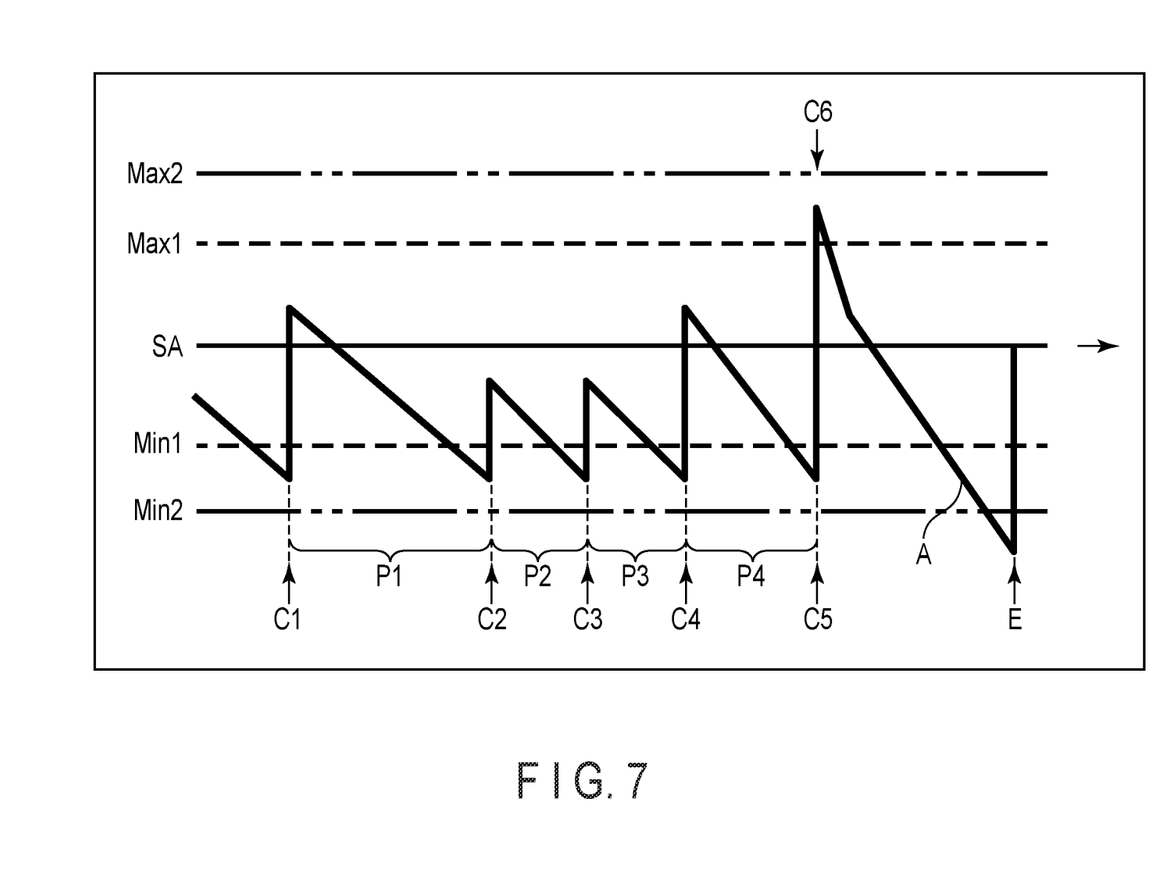
FIG. 7 is a view showing changes in the quantity of application carried out by the application device according to this embodiment.

FIG. 7 is a view showing changes in the quantity of application carried out by the application device 100 according to this embodiment. FIG. 7 is a view formed by extracting part of the application quantities calculated by the calculation control module 94 in step S103 of each loop when the operations of the flowchart shown in FIG. 6 are repetitively executed. In FIG. 7, the vertical direction indicates the application quantity, and lateral direction indicates the elapsed time. The polygonal line in FIG. 7 indicates application quantities A of the adhesive calculated by the calculation control module 94.

Let the upper limit to the aforementioned specified range of the application quantity of the adhesive be a threshold Max1, and lower limit to the specified range be a threshold Min1. When the application quantity of the adhesive calculated by the calculation control module 94 is within the range from the threshold Max1 to the threshold Min1, the calculation control module 94 determines in step S104 that the application quantity is within the specified range. The central part of the specified range is the criterion value SA.

Let the upper limit to the range within which a correction can be made by the application device 100 in step S105 be a threshold Max2, and lower limit to the range be a threshold Min2. In the example of FIG. 7, corrections C1 to C6 for correction to the application condition to be made by the discharge control module 92 are made in chronological order.

Here, let any one of the corrections to be made in chronological order to the application condition be a first correction, and correction made prior to the first correction be a second correction. In this case, the amount of correction to the application condition in the first correction is set on the basis of the amount of correction to the application condition in the second correction and correction interval P from the second correction to the first correction.

The correction interval P may be the time from the time when the second correction is made to the time when it is determined, in step S104 immediately before the first correction is made, that the application quantity is outside the specified range or may be the time from the time when it is determined, in step S104 immediately before the second correction is made, that the application quantity is outside the specified range to the time when it is determined, in step S104 immediately before the first correction is made, that the application quantity is outside the specified range.

In this embodiment, the case where the application condition which becomes the object of correction is application pressure and, furthermore, as the conditions for determining the correction amount (increase/decrease in application pressure) of the first correction, the following conditions 1 to 4 are determined is assumed. However, the conditions for determining the correction amount of the first correction are not limited to this example.

[Condition 1]

When the correction interval P is greater than or equal to the specified time Ps (P≥Ps) and, furthermore, application quantity A is less than or equal to the threshold Min1 and is greater than or equal to the threshold Min2 (Min2≤A≤Min1), the application pressure be increased by a first correction amount Q1.

[Condition 2]

When the application quantity A is greater than or equal to the threshold Max1 and is less than or equal to the threshold Max2 (Max1≤A≤Max2), the application pressure be reduced by the first correction amount Q1.

[Condition 3]

When the correction interval P is less than the specified time Ps (P<Ps), application quantity A is less than or equal to the threshold Min1 and is greater than or equal to the threshold Min2 (Min2≤A≤Min1) and, furthermore, correction amount of the last second correction is the first correction amount Q1, the application pressure be increased by a second correction amount Q2 greater than the first correction amount Q1 (Q1<Q2).

[Condition 4]

When the correction interval P is less than the specified time Ps (P<Ps), application quantity A is less than or equal to the threshold Min1 and is greater than or equal to the threshold Min2 (Min2≤A≤Min1) and, furthermore, correction amount of the last second correction is greater than or equal to the second correction amount Q2, the application pressure be increased by a third correction amount Q3 greater than the second correction amount Q2 (Q2<Q3).

In aforementioned step S106, the correction amount is determined on the basis of these conditions 1 to 4. Furthermore, in aforementioned step S105, whether or not a correction can be made is determined on the basis of the following condition 5.

[Condition 5]

The application quantity A is greater than the threshold Max2 (A>Max2) or is less than the threshold Min2 (A<Min2).

It should be noted that the relationships between the first correction amount Q1, second correction amount Q2, and third correction amount Q3 can appropriately be determined in consideration of the characteristics and the like of the application device 100 and adhesive. As one example, the correction amounts Q1 to Q3 may be determined in such a manner that the condition Q2−Q1<Q3−Q2 is established. In this case, for example, the third correction amount Q3 may be greater than or equal to twice the second correction amount Q2.

Hereinafter, on the basis of the conditions 1 to 5, the change in the application quantity A of the adhesive and corrections C2 to C6 after the correction C1 in FIG. 7 is made will be described.

First, when the correction C1 is made, the application quantity A increases to a value within the specified range (Min1<A<Max1). Immediately after the correction C1 is made, the application quantity A is greater than or equal to the criterion value SA. Thereafter, steps S101 to S104, S109, and S110 are repetitively executed and thus when a certain period of time elapses, the application quantity A gradually decreases. When the usage elapsed time of the adhesive becomes longer, the viscosity thereof increases due to volatilization or the like of the solvent contained in the adhesive. For this reason, even when the adhesive is applied at a given application pressure by using the dispenser 60, the application quantity of the adhesive decreases.

When the application quantity A decreases to a value less than or equal to the threshold Min1 after the correction C1, it is determined in step S104 that the application quantity A is not within the specified range, and thus the correction C2 is made. At the timing of the correction C2 in FIG. 7, the application quantity A is less than or equal to the threshold Min1 and is greater than or equal to the threshold Min2. Accordingly, it is determined in step S105 that a correction can be made by the application device 100. Then, in step S106, the necessary correction amount is determined.

Here, it is assumed that the correction amount of the correction C1 is the first correction amount Q1, and correction interval P1 from the correction C1 to the correction C2 is greater than or equal to the specified time Ps. In this case, the correction amount of the correction C2 is determined to be an increase by the first correction amount Q1 according to the aforementioned condition 1. The discharge control module 92 makes the correction C2 to the application pressure on the basis of the correction amount determined in this way, whereby a new application pressure is set.

In the example of FIG. 7, when the correction C2 is made, the application quantity A increases to a value within the specified range. However, even immediately after the correction C2 is made, the application quantity A is less than or equal to the criterion value SA. Thereafter, when a certain time elapses, the application quantity A gradually decreases.

After the correction C2, when the application quantity A decreases to a value less than or equal to the threshold Min1, it is determined in step S104 again that the application quantity A is not within the specified range, and the correction C3 is made. At the timing of the correction C3 in FIG. 7, the application quantity A is less than or equal to the threshold Min1 and is greater than or equal to the threshold Min2. Accordingly, it is determined in step S105 that a correction can be made by the application device 100. Then, in step S106, the necessary correction amount is determined.

Here, it is assumed that the correction interval P2 from the correction C2 to the correction C3 is less than the specified time Ps. In this case, the correction amount of the correction C2 is the first correction amount Q1, and hence the correction amount of the correction C3 is determined to be an increase by the second correction amount Q2 according to the aforementioned condition 3. The discharge control module 92 makes the correction C3 to the application pressure on the basis of the correction amount determined in this manner, whereby a new application pressure is set.

In the example of FIG. 7, when the correction C3 is made, the application quantity A increases to a value within the specified range. However, even immediately after the correction C3 is made, the application quantity A is less than or equal to the criterion value SA. Thereafter, when a certain time elapses, the application quantity A gradually decreases.

After the correction C3, when the application quantity A decreases to a value less than or equal to the threshold Min1, it is determined in step S104 again that the application quantity A is not within the specified range, and the correction C4 is made. At the timing of the correction C4 in FIG. 7, the application quantity A is less than or equal to the threshold Min1 and is greater than or equal to the threshold Min2. Accordingly, it is determined in step S105 that a correction can be made by the application device 100. Then, in step S106, the necessary correction amount is determined.

Here, it is assumed that the correction interval P3 from the correction C3 to the correction C4 is less than the specified time Ps. In this case, the correction amount of the correction C3 is the second correction amount Q2, and hence the correction amount of the correction C4 is determined to be an increase by the third correction amount Q3 according to the aforementioned condition 4. The discharge control module 92 makes the correction C4 to the application pressure on the basis of the correction amount determined in this way, whereby a new application pressure is set.

In the example of FIG. 7, when the correction C4 is made, the application quantity A increases to a value within the specified range and is greater than the criterion value SA. As described above, the third correction amount Q3 is greater than the first correction amount Q1 of the correction C2 and second correction amount Q2 of the correction C3, and hence the application quantity A immediately after the correction by the third correction amount Q3 is made can easily increase in such a manner as to exceed the criterion value SA. Thereafter, when a certain time elapses, the application quantity A gradually decreases.

After the correction C4, when the application quantity A decreases to a value less than or equal to the threshold Min1, it is determined in step S104 again that the application quantity A is not within the specified range, and the correction C5 is made. At the timing of the correction C5 in FIG. 7, the application quantity A is less than or equal to the threshold Min1 and is greater than or equal to the threshold Min2. Accordingly, it is determined in step S105 that a correction can be made by the application device 100. Then, in step S106, the necessary correction amount is determined.

Here, it is assumed that the correction interval P4 from the correction C4 to the correction C5 is less than the specified time Ps. In this case, the correction amount of the correction C4 is the third correction amount Q3 greater than or equal to the second correction amount Q2, and hence the correction amount of the correction C5 is determined to be an increase by the third correction amount Q3 according to the aforementioned condition 4. The discharge control module 92 makes the correction C5 to the application pressure on the basis of the correction amount determined in this way, whereby a new application pressure is set.

In the example of FIG. 7, when the correction C5 is made, the application quantity A increases to a value greater than or equal to the threshold Max1 and is less than or equal to the threshold Max2. That is, the application quantity A immediately after the correction C5 is outside the specified range. In this case, it is determined in step S104 immediately after the correction C5 that the application quantity A is not within the specified range, and thus the correction C6 is made without going through the application of the adhesive to the object in step S109.

At the timing of the correction C6 in FIG. 7, the application quantity A is greater than or equal to the threshold Max1 and is less than or equal to the threshold Max2. Accordingly, it is determined in step S105 that a correction can be made by the application device 100. Then, in step S106, the necessary correction amount is determined.

Here, the application quantity A is greater than or equal to the threshold Max1 and is less than or equal to the threshold Max2, and hence the correction amount of the correction C6 is determined to be a decrease by the first correction amount Q1 according to the aforementioned condition 2. The discharge control module 92 makes the correction C6 to the application pressure on the basis of the correction amount determined in this way, whereby a new application pressure is set. When the correction C6 is made, the application quantity A decreases to a value within the specified range. Thereafter, with the elapse of time, the application quantity decreases.

In the example of FIG. 7, at the timing E after the correction C6, the application quantity A decreases to a value less than the threshold Min2. At this time, it is determined in step S104 again that the application A is not within the specified range. However, the application quantity A is less than the threshold Min2, and hence it is determined in step S105 that a correction cannot be made by the application device 100 according to the aforementioned condition 5. Concomitantly with this, the control device 90 stops the application device 100 in step S108. When the application device 100 is stopped, appearance inspection of the application device 100, and adjustment of the application quantity based on a manual operation of the application device 100 are executed by the worker, and inspection of each of the devices constituting the application device 100 is further executed as the need arises.

As described above, particularly in this embodiment, prior to application of the adhesive, the application quantity of the adhesive applied to a part different from the specified part of the object W is calculated and, when a correction is needed, the necessary correction amount is automatically determined from the past correction amount and correction interval. The correction amount is not set according to the predetermined time, and the correction amount is determined by monitoring the past correction amount and correction interval and by managing the changing trend of the application quantity, and hence it is possible to select the optimum correction pressure according to the various states of the adhesive and situations of the nozzle.

With the correction according to this embodiment, it is possible to take an appropriate measure with the minimum correction operation without making useless corrections, and hence it is possible to prevent a deterioration in takt time from occurring. Further, by making an approximate vale based on the application area and application height the application quantity, accurate and prompt feedback is enabled.

It should be noted that in this embodiment, the case where the amount of correction to the application condition of the first correction (correction of this time) is determined on the basis of the conditions 1 to 4 in which both the correction amount of the second correction (correction of the last time) and correction interval are used is exemplified. However, the correction amount of the first correction may also be determined on the basis of only one of the correction amount of the second correction and correction interval.

Further, the threshold Min1, threshold Max1, and specified time Ps may be set in a multistage form. In this case, the application condition may more finely be corrected than the aforementioned correction amounts Q1 to Q3 on the basis of to which threshold-range the application quantity belongs or to which specified-time range the correction interval P belongs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. An application method for applying an adhesive to an object, the application method being executed by an application device including a dispenser configured to discharge the adhesive, and the method comprising:
  controlling the dispenser, prior to applying the adhesive to a specified part of the object, to apply the adhesive to a second part of the object different from the specified part;
  calculating an application quantity of the adhesive applied to the second part of the object;
  determining whether the application quantity is within a specified range;
  in response to determining that the application quantity is not within the specified range, determining whether the application quantity is within a correction-enabled range;
  in response to determining that the application quantity is within the correction-enabled range at a first timing, determining a necessary correction amount by which to correct an application pressure used by the dispenser to discharge the adhesive, the necessary correction amount being determined based on (i) a necessary correction amount at a second timing at which the application quantity is determined to be within the correction-enabled range, and (ii) an interval between the first timing and the second timing, the second timing being prior to the first timing;
  correcting the application pressure at the first timing, based on the necessary correction amount; and
  controlling the dispenser to apply the adhesive to the specified part of the object using the application pressure corrected based on the necessary correction amount, in a case in which the application quantity is determined to be within the specified range,
  wherein the necessary correction amount at the first timing is greater than the necessary correction amount at the second timing when the interval is less than a specified time.

2. The application method of claim 1, wherein the calculating of the application quantity includes performing imaging of the adhesive applied to the second part of the object by a camera, and calculating the application quantity of the adhesive based on an image acquired by the imaging performed by the camera.

3. The application method of claim 2, wherein the calculating calculates the application quantity based on an area and a height of the adhesive, the area and the height of the adhesive being obtained from the image of the adhesive acquired by the imaging performed by the camera.

4. The application method of claim 2, wherein:
the camera comprises a plurality of cameras which image the adhesive applied to the second part from respective different angles,
the application method further comprises subjecting images acquired by the plurality of cameras from the respective different angles to image processing, and
the calculating calculates the application quantity of the adhesive based on the images having been subject to the image processing.

5. The application method of claim 4, wherein the image processing comprises at least one of noise removal and brightness correction.

6. The application method of claim 1, wherein:
the specified range includes a first threshold value, and a second threshold value greater than the first threshold value,
the correction-enabled range includes a third threshold value less than the first threshold value, and a fourth threshold value greater than both the second threshold value and the third threshold value, and
when the correction interval is less than the specified time, the application quantity is greater than or equal to the third threshold value and less than or equal to the first threshold value, and a change to the application pressure at the second timing corresponds to an increase of a first amount, the correcting sets the change to the application pressure at the first timing to increase by a second amount larger than the first amount.

7. The application method of claim 1, wherein:
the application device is an application device for manufacturing a disk drive suspension,
the object comprises a flexure included in the disk drive suspension, and a frame to which a plurality of flexures including the flexure are fixed, and
the second part of the object is a part of the frame.

8. The application method of claim 1, wherein:
the dispenser comprises a discharge drive mechanism operably coupled to a syringe having a nozzle from which the adhesive is discharged,
the controlling the dispenser comprises controlling the discharge drive mechanism to regulate a pressure of compressed air supplied to the syringe, and
the correcting the application pressure comprises adjusting the application quantity by controlling regulation of the compressed air supplied to the syringe by the discharge drive mechanism.

* * * * *